United States Patent
Jang

(10) Patent No.: US 9,263,708 B2
(45) Date of Patent: Feb. 16, 2016

(54) METHOD OF REMOVING PARTICLES FROM A DISPLAY PANEL AND APPARATUS FOR PERFORMING THE SAME

(71) Applicant: Samsung Display Co., Ltd., Yongin, Gyeonggi-Do (KR)

(72) Inventor: Joo-Nyung Jang, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/255,729

(22) Filed: Apr. 17, 2014

(65) Prior Publication Data

US 2015/0017744 A1 Jan. 15, 2015

(30) Foreign Application Priority Data

Jul. 9, 2013 (KR) .................. 10-2013-0080075

(51) Int. Cl.
*H01L 21/00* (2006.01)
*H01L 51/56* (2006.01)
*H01L 51/00* (2006.01)

(52) U.S. Cl.
CPC ............ *H01L 51/56* (2013.01); *H01L 51/0025* (2013.01); *H01L 2251/568* (2013.01)

(58) Field of Classification Search
CPC .............. H01J 2237/022; H01J 2237/0225; G02F 2001/1316; H01L 2251/568
USPC ................. 15/1.51; 438/4; 204/672
See application file for complete search history.

(56) References Cited

U.S. PATENT DOCUMENTS

| | | | |
|---|---|---|---|
| 5,531,862 A * | 7/1996 | Otsubo et al. | 438/798 |
| 6,526,997 B1* | 3/2003 | Henley | 134/1.3 |
| 2004/0016443 A1 | 1/2004 | Sasaki | |
| 2011/0005010 A1* | 1/2011 | Hsia et al. | 15/1.51 |
| 2011/0108056 A1* | 5/2011 | Ishizawa et al. | 134/1 |
| 2013/0192630 A1* | 8/2013 | Okada et al. | 134/1.3 |

FOREIGN PATENT DOCUMENTS

| | | |
|---|---|---|
| KR | 10-2000-0026442 A | 5/2000 |
| KR | 10-2004-0010146 A | 1/2004 |
| KR | 10-2008-0048635 A | 6/2008 |

* cited by examiner

*Primary Examiner* — Caridad Everhart
(74) *Attorney, Agent, or Firm* — Knobbe, Martens, Olson & Bear, LLP

(57) ABSTRACT

A method of removing particles from a display panel is disclosed. In one aspect, the method includes charging the particles and applying an electric field to the charged particles to capture the charged particles. Organic particles and inorganic particles may be forcibly charged to capture the organic and inorganic particles using a metal bar so that the organic and inorganic particles may be substantially removed.

17 Claims, 7 Drawing Sheets

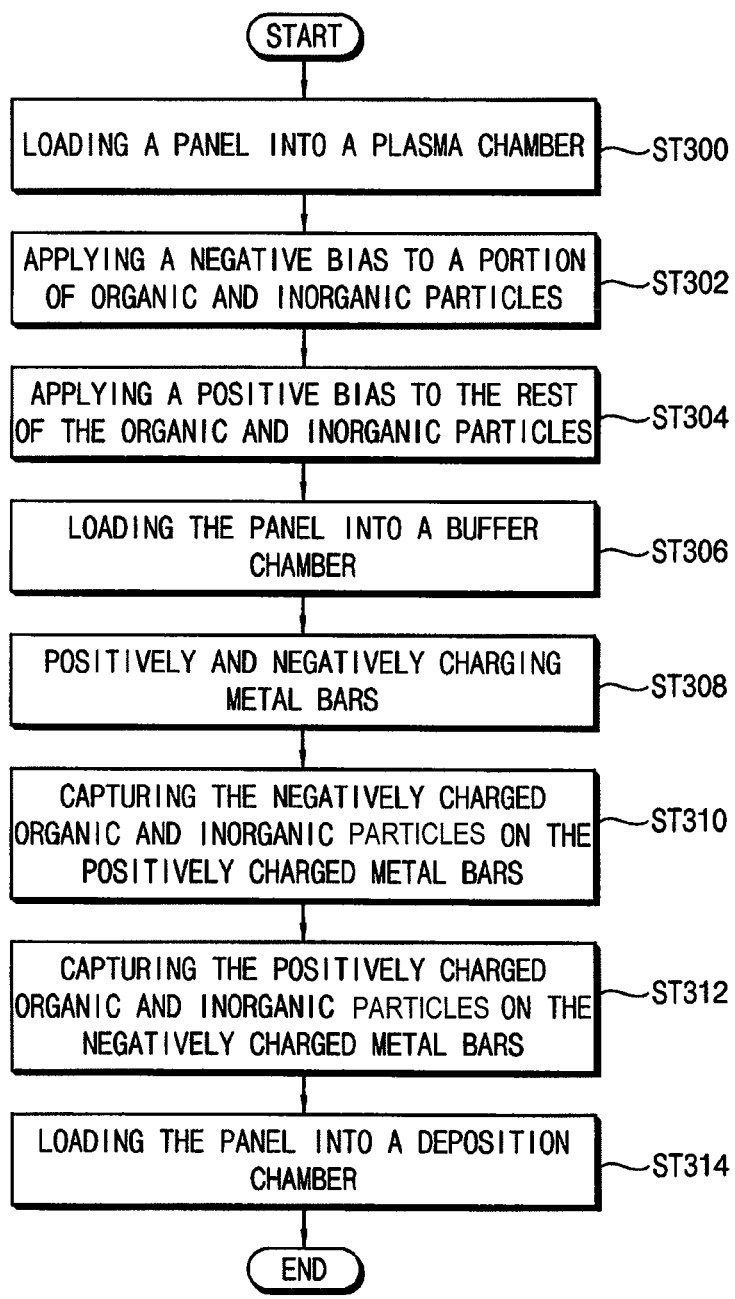

METHOD OF REMOVING PARTICLES FROM A DISPLAY PANEL AND APPARATUS FOR PERFORMING THE SAME

CROSS-REFERENCE TO RELATED APPLICATIONS

This application claims priority under 35 USC §119 to Korean Patent Application No. 10-2013-0080075, filed on Jul. 9, 2013 in the Korean Intellectual Property Office (KIPO), the contents of which are herein incorporated by reference in its entirety.

BACKGROUND

1. Field

The described technology generally relates to a method of removing particles from a display panel and an apparatus for performing the same.

2. Description of the Related Technology

Generally, a dark spot can be formed in an OLED panel when there are extraneous particles in the OLED panel. The particles can have a negative influence on the manufacturing yield of televisions using the OLED panel. Thus, it may be required to remove the particles from the OLED panel.

In general, the particles are removed using an electrostatic chuck (ESC) in a plasma chamber. Metal particles among the particles can be easily removed using an electric field applied to the ESC. However, organic particles and inorganic particles may not be easily removed using an electric field.

SUMMARY OF CERTAIN INVENTIVE ASPECTS

One inventive aspect is a method of removing organic particles and inorganic particles from a display panel.

Another aspect is an apparatus for performing the above-mentioned method.

Another aspect is a method of removing particles from an organic light-emitting diode (OLED) display panel.

Another aspect is a method of removing particles from a panel. In the method of removing the particles from the panel, the particles around the panel may be charged. An electric field may be applied to the charged particles to capture the charged particles.

Charging the particles may include applying a positive bias to the particles to form positively charged particles, and applying a negative bias to the particles to form negatively charged particles.

Applying the electric field to the charged particles may include applying a negative electric field to the positively charged particles, and applying a positive electric field to the negatively charged particles.

Charging the particles may be performed using plasma before forming an organic layer on the panel.

Applying the electric field to the charged particles may be performed under a pressure for forming the organic layer between forming the organic layer on the panel and removing the particles using the plasma.

The particles may include organic particles and inorganic particles.

Another aspect is an apparatus for removing particles from a panel. The apparatus may include a charging unit and a capturing unit. The charging unit may charge the particles around the panel. The capturing unit may apply an electric field to the charged particles to capture the charged particles.

The charging unit may selectively apply a positive bias and a negative bias to the particles.

The capturing unit may include a metal bar arranged over the panel to capture the charged particles, an electrode for charging the metal bar, and an insulating layer formed on the metal bar to maintain the captured particles on the metal bar.

The metal bar may include a plurality of bars.

The electrode may include an anode for positively charging a portion of the metal bars, and a cathode for negatively charging the rest of the metal bars.

The positively charged metal bars and the negatively charged metal bars may be alternately arranged.

The apparatus may further include a transferring unit for moving the metal bars over the panel.

The transferring unit may include a frame for fixing the metal bars thereto, and an actuator for moving the frame over the panel.

The charging unit may be positioned in a plasma chamber where the particles may be removed. The plasma chamber may be arranged before a deposition chamber where an organic layer may be formed.

The capturing unit may be positioned in a buffer chamber where a pressure for forming the organic layer may be provided to the panel. The buffer chamber may be arranged between the deposition chamber and the plasma chamber.

According to at least some embodiments, the organic particles and the inorganic particles may be forcibly charged to be captured using the metal bar so that the organic and inorganic particles may be substantially removed easily. Further, the insulating layer on the metal bar may maintain the captured particles on the metal bar to substantially prevent the captured particles on the metal bar from being dropped. Thus, the particles may be substantially removed from the panel using the apparatus including the metal bar and the insulating layer.

BRIEF DESCRIPTION OF THE DRAWINGS

Exemplary embodiments will be more clearly understood from the following detailed description taken in conjunction with the accompanying drawings. FIGS. 1 to 11 represent non-limiting, embodiments as described herein.

FIG. 1 is a block diagram illustrating an apparatus for removing particles from a panel in accordance with exemplary embodiments.

FIG. 2 is a cross-sectional view illustrating an operation for applying a negative electric field to the particles using the charging unit of the apparatus of FIG. 1.

FIG. 3 is a cross-sectional view illustrating an operation for applying a positive electric field to the particles using the charging unit of the apparatus of FIG. 1.

FIG. 4 is a cross-sectional view illustrating the capturing unit of the apparatus in FIG. 1.

FIG. 5 is a plan view illustrating the capturing unit of FIG. 4.

FIG. 6 is an enlarged cross-sectional view illustrating the metal bar of the capturing unit of FIG. 4.

FIG. 7 is a cross-sectional view illustrating an operation for capturing charged particles using the capturing unit of FIG. 4.

FIG. 8 is a cross-sectional view illustrating an operation for capturing negatively charged particles using an anode of the capturing unit of FIG. 4.

FIG. 9 is a cross-sectional view illustrating an operation for capturing positively charged particles using a cathode of the capturing unit of FIG. 4.

FIG. 10 is a cross-sectional view illustrating a capturing unit in accordance with exemplary embodiments.

FIG. 11 is a flow chart illustrating a method of removing particles from a panel using the apparatus of FIG. 1.

DETAILED DESCRIPTION OF CERTAIN INVENTIVE EMBODIMENTS

Figure 1:
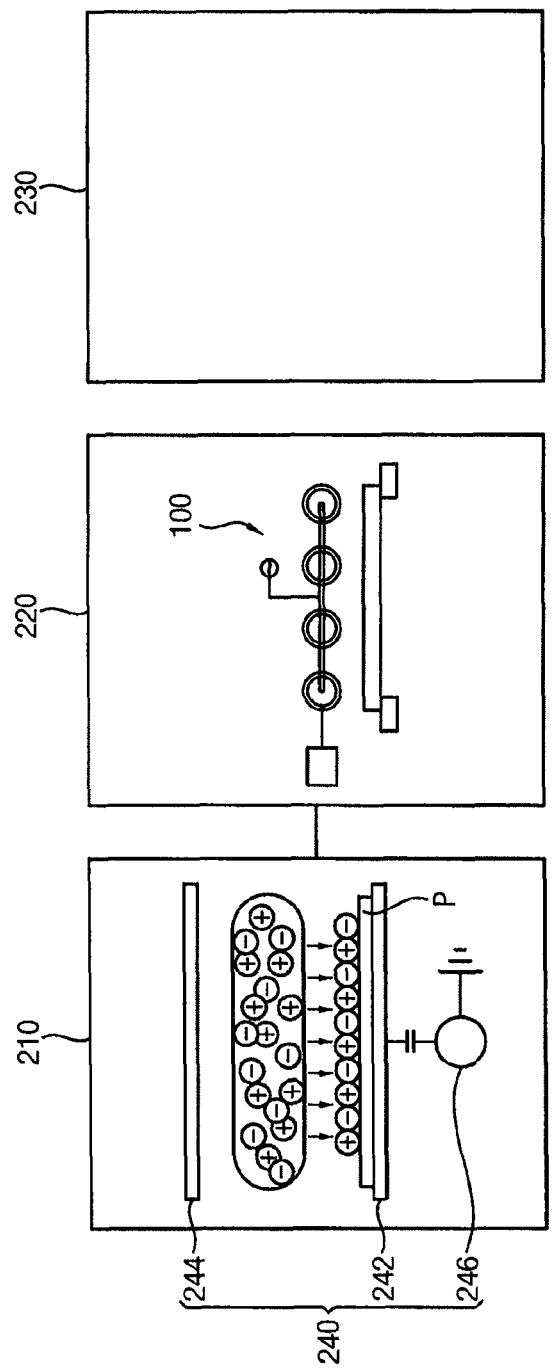

Various embodiments will be described more fully hereinafter with reference to the accompanying drawings, in which some embodiments are shown. The described technology may, however, be embodied in many different forms and should not be construed as limited to the embodiments set forth herein. Rather, these embodiments are provided so that this description will be thorough and complete, and will fully convey the scope of the described technology to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein are to be interpreted accordingly.

The terminology used herein is for the purpose of describing particular embodiments only and is not intended to be limiting of the described technology. As used herein, the singular forms "a," "an" and "the" are intended to include the plural form as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the described technology.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an apparatus for removing particles from a panel in accordance with exemplary embodiments.

Referring to FIG. 1, before an organic layer may be formed on a panel P in a deposition chamber 230, particles generated in preceding processes may be substantially removed in a plasma chamber 210. Further, before the panel P from which the particles may be substantially removed is loaded into the deposition chamber 230, it may be required to expose the panel P to the processing atmosphere (or pressure) of the deposition chamber 230. Thus, a buffer chamber 220 may be positioned between the plasma chamber 210 and the deposition chamber 230. In exemplary embodiments, the buffer chamber 220 may have a low pressure which is substantially the same as that in the deposition chamber 230. The panel P may include a display panel such as an OLED panel.

An apparatus for removing the particles from the panel P may include a charging unit (or charger) 240 and a capturing unit 100. The charging unit 240 may forcibly charge organic and inorganic particles. The capturing unit 100 may apply an electric field to the organic and inorganic particles charged by the charging unit 240 to capture the charged organic and inorganic particles.

The charging unit 240 may be arranged in the plasma chamber 210. The charging unit 240 may include an anode 242, a cathode 244 and a charging member 246. The panel P may be positioned on the anode 242. The cathode 244 may be positioned over the anode 242. The charging member 246 may be electrically connected to the anode 242. Thus, plasma may be generated between the anode 242 and the cathode 244.

Figure 2:
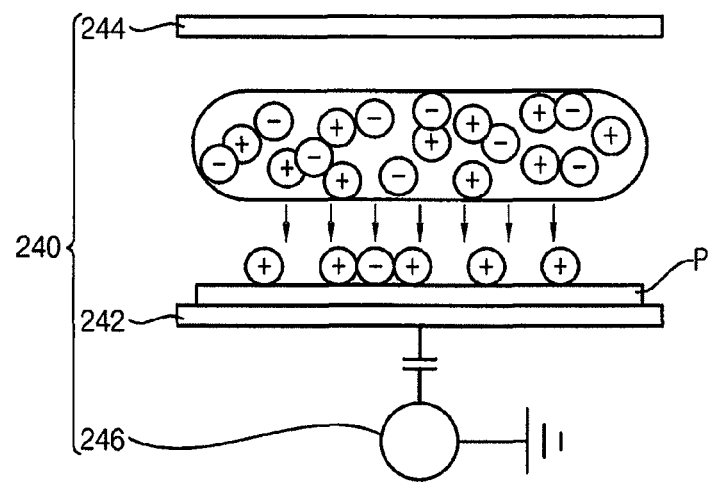
Figure 3:
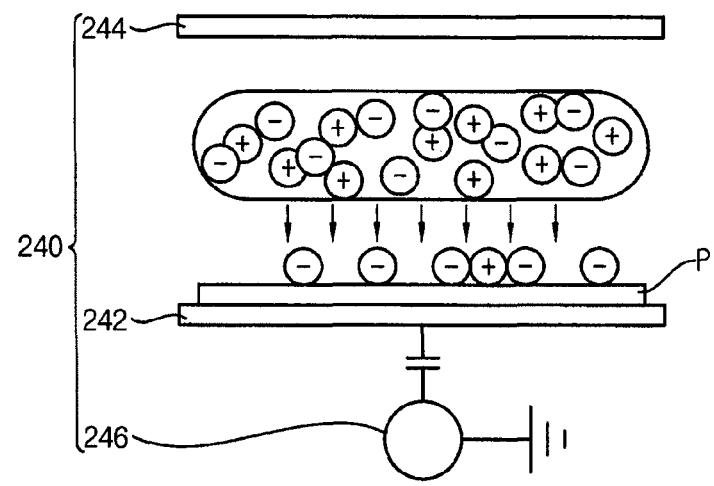

FIG. 2 is a cross-sectional view illustrating an operation for applying a negative electric field to the particles using the charging unit 240 of the apparatus of FIG. 1, and FIG. 3 is a cross-sectional view illustrating an operation for applying a positive electric field to the particles using the charging unit 240 of the apparatus of FIG. 1.

Referring to FIGS. 2 and 3, the charging member 244 may selectively apply a negative bias and/or a positive bias to the organic and inorganic particles to positively and/or negatively charge the organic and inorganic particles. The charged organic and inorganic particles may be distributed on an upper surface of the panel P.

The capturing unit 100 may be arranged in the buffer chamber 220. The capturing unit 100 may apply an electric field to the charged organic and inorganic particles to capture the charged organic and inorganic particles using an electric force.

Figure 4:
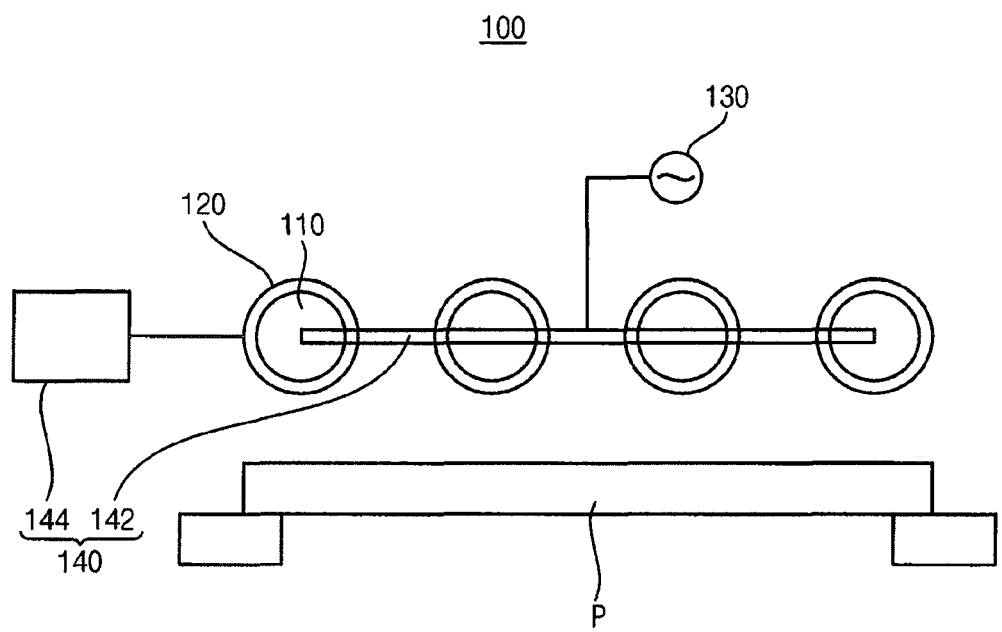
Figure 5:
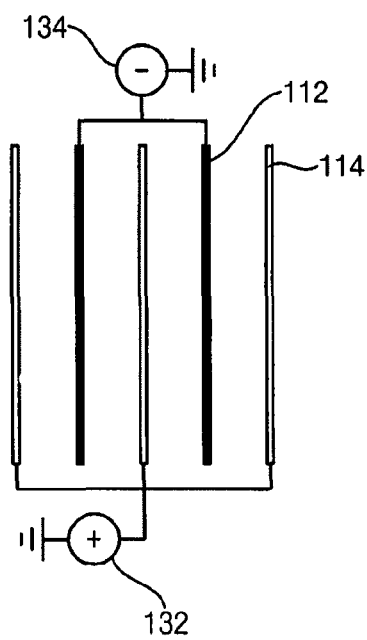
Figure 6:
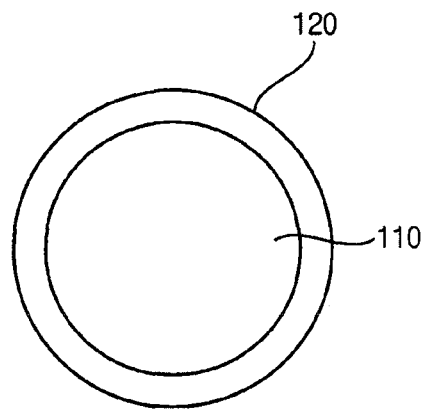
Figure 7:
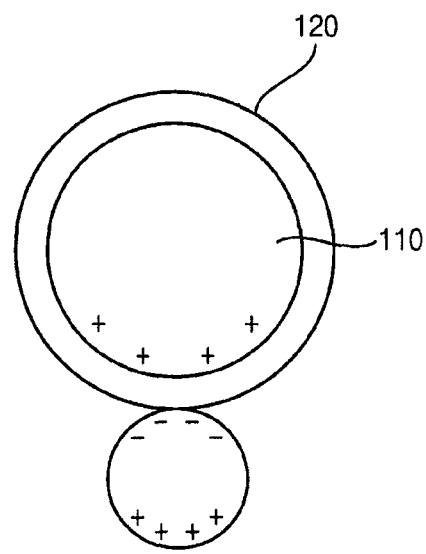
Figure 7:
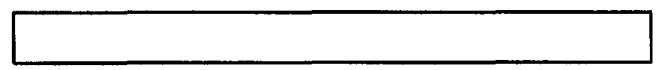
Figure 8:
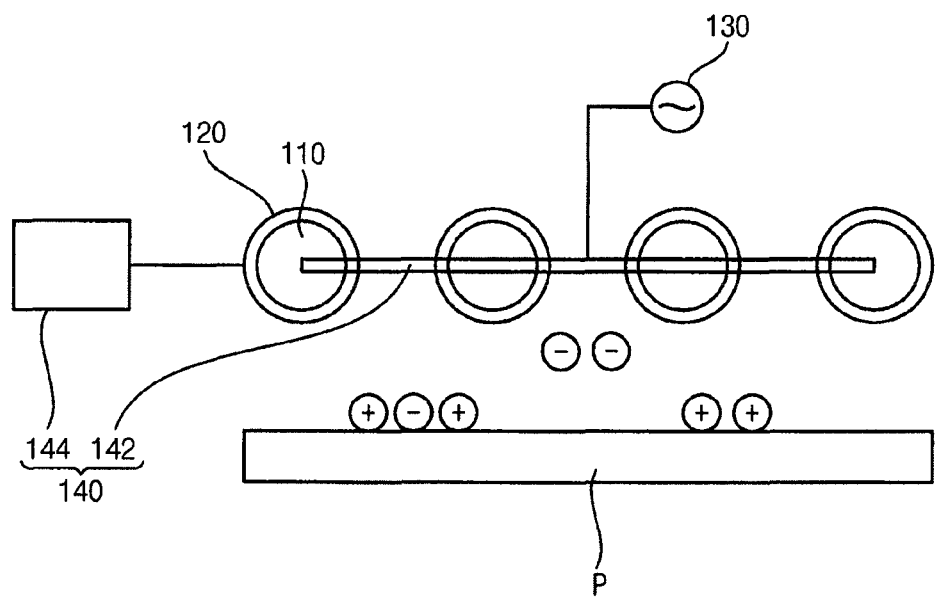
Figure 9:
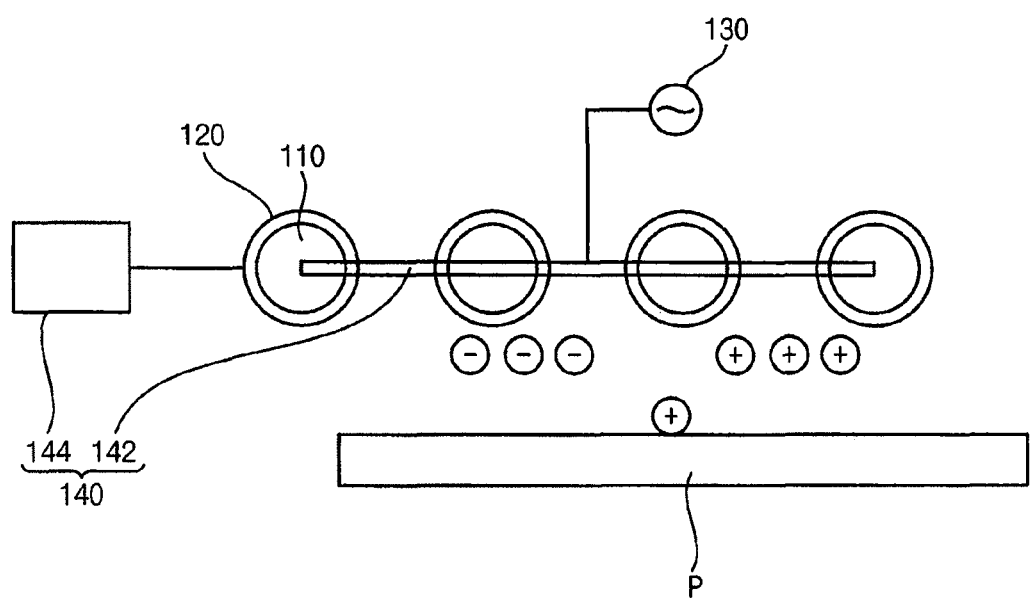

FIG. 4 is a cross-sectional view illustrating the capturing unit 100 of the apparatus of FIG. 1, FIG. 5 is a plan view illustrating the capturing unit 100 of FIG. 4, and FIG. 6 is an enlarged cross-sectional view illustrating a metal bar 110 of the capturing unit 100 in FIG. 4. FIG. 7 is a cross-sectional view illustrating an operation for capturing charged particles using the capturing unit 100 of FIG. 4, FIG. 8 is a cross-sectional view illustrating an operation for capturing negatively charged particles using an anode 132 of the capturing unit 100 of FIG. 4, and FIG. 9 is a cross-sectional view illustrating an operation for capturing positively charged particles using a cathode 134 of the capturing unit 100 of FIG. 4.

Referring to FIGS. 4 to 9, the capturing unit 100 may include a metal bar 110, an insulating layer 120, an electrode 130 and a transferring unit 140.

The metal bar 110 may be positioned over the panel P. In exemplary embodiments, the metal bar 110 may have a substantially cylindrical shape. The metal bar 110 may include a plurality of bars. Alternatively, the metal bar 110 may be a single bar. The metal bar 110 may capture the charged organic and inorganic particles on the upper surface of the panel P using an electric force.

The electrode 130 may be electrically connected to the metal bar 110 to charge the metal bar 110. In exemplary embodiments, the electrode 130 may include an anode 132 and a cathode 134. The anode 132 and the cathode 134 may be alternately connected to the metal bars 110 to form positively charged metal bars 112 and negatively charged metal bars 114. Further, the positively charged metal bars 112 and the negatively charged metal bars 114 may be alternately arranged one by one.

The insulating layer 120 may be formed on an outer surface of the metal bar 110. The insulating layer 120 may substantially prevent charge from being transferred between the charged organic and inorganic particles and the metal bars 110 to maintain the charged organic and inorganic particles on the metal bars 110. In exemplary embodiments, the insulating layer 120 may include a kepton tape.

The transferring unit 140 may move the metal bars 110 substantially horizontally over the panel P. The metal bars 110 may capture the charged organic and inorganic particles from the panel P using an electric force as they are moved substantially horizontally by the transferring unit 140 over the panel P.

In exemplary embodiments, the transferring unit 140 may include a frame 142 and an actuator 144. The metal bars 110 may be fixed to the frame 142. The actuator 144 may provide the frame 142 with a substantially horizontal straight force to move the frame 142 and the metal bars 110 substantially horizontally over the panel P. The actuator 144 may include a motor, a cylinder, etc.

Therefore, as shown in FIGS. 8 and 9, the negatively charged organic and inorganic particles may be captured on the positively charged metal bars 112. In contrast, the positively charged organic and inorganic particles may be captured on the negatively charged metal bars 114.

Figure 10:
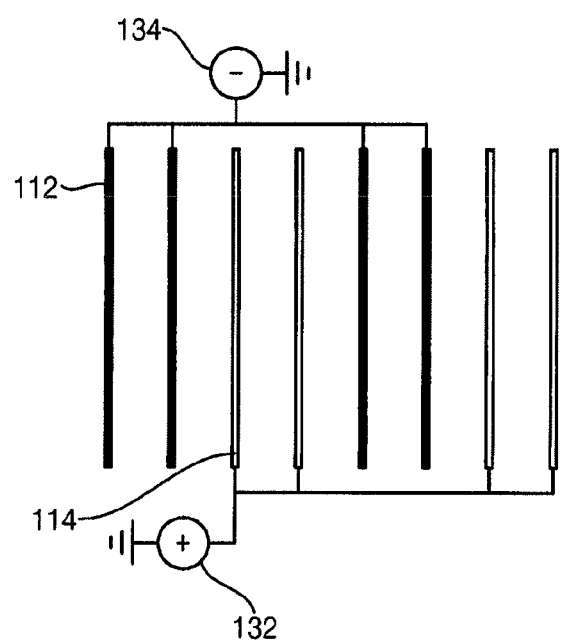

FIG. 10 is a cross-sectional view illustrating a capturing unit 100a in accordance with exemplary embodiments.

The capturing unit 100a may include elements substantially the same as those of the capturing unit 100 of FIG. 4 except for the connection structure between the metal bars 110 and the electrode 130. Thus, the same reference numerals refer to the same elements and any further illustrations with respect to the same elements may be omitted herein for brevity.

Referring to FIG. 10, the anode 132 may be electrically connected to two sequentially arranged metal bars 110 to form two positively charged metal bars 112. The cathode 134 may be electrically connected to two sequentially arranged metal bars 110 following the two positively charged metal bars 112 to form two negatively charged metal bars 114. Thus, the two positively charged metal bars 112 and the two negatively charged metal bars 114 may be alternately arranged. Because the two positively charged metal bars 112 and the two negatively charged metal bars 114 may be sequentially arranged, the charged organic and inorganic particles may be captured by stronger electric force.

In exemplary embodiments, the two metal bars 110 may be connected to the anode 132 or the cathode 134. Alternatively, at least three metal bars 110 may be connected to the anode 132 or the cathode 134.

In exemplary embodiments, the charging unit 240 and the capturing unit 100 may be arranged in the plasma chamber 210 and the buffer chamber 220, respectively. Alternatively, the charging unit 240 and the capturing unit 100 may be located at other positions.

FIG. 11 is a flow chart illustrating a method of removing particles from a panel using the apparatus of FIG. 1. Depending on the embodiment, additional states may be added, two or more states combined into one state, certain states removed, or the order of the states changes in FIG. 11.

Referring to FIGS. 1 and 11, in step ST300, the panel P may be loaded into the plasma chamber 210.

In step ST302, the charging member 246 may apply a negative bias to a portion of the organic and inorganic particles to negatively charge the portion of the organic and inorganic particles.

In step ST304, the charging member 246 may apply a positive bias to the rest of the organic and inorganic particles to positively charge the rest of the organic and inorganic particles.

In step ST306, the panel P may be loaded into the buffer chamber 220.

In step ST308, the electrode 130 may positively and negatively charge the metal bars 110 to form the positively charged metal bars 112 and the negatively charged metal bars 114.

In step ST310, the positively charged metal bars 112 may capture the negatively charged organic and inorganic particles.

In step ST312, the negatively charged metal bars 114 may capture the positively charged organic and inorganic particles.

In step ST314, the panel from which the organic and inorganic particles have been substantially removed may be loaded into the deposition chamber 230. An organic layer may be formed on the panel P in the deposition chamber 230.

In exemplary embodiments, the particles may be substantially removed by the apparatus in FIG. 1. Alternatively, the particles may be substantially removed by the apparatus in FIG. 10.

According to exemplary embodiments, the organic and inorganic particles may be forcibly charged to capture the organic and inorganic particles using the metal bar so that the organic and inorganic particles may be substantially removed easily. Further, the insulating layer on the metal bar may maintain the captured particles on the metal bar to substantially prevent the captured particles on the metal bar from being dropped. Thus, the particles may be substantially removed from the panel using the apparatus including the metal bar and the insulating layer.

The foregoing is illustrative of embodiments and is not to be construed as limiting thereof. Although a number of embodiments have been described, those skilled in the art will readily appreciate that many modifications are possible to the embodiments without materially departing from the novel teachings and advantages of the described technology. Accordingly, all such modifications are intended to be included within the scope of the described technology as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of removing particles from a display panel, comprising:
    charging the particles; and
    applying an electric field to the charged particles so that the charged particles are captured,
    wherein the charging is performed i) in a plasma chamber and ii) before forming an organic layer on the display panel under pressure.

2. The method of claim 1, wherein the applying is performed i) under a pressure that is substantially the same as the pressure used for forming the organic layer and ii) between the charging and the forming of the organic layer.

3. The method of claim 1, wherein the particles comprise organic particles and inorganic particles.

4. The method of claim 1, wherein the charging comprises:
    applying a positive bias to a portion of the particles so as to positively charge the portion of the particles; and
    applying a negative bias to the remaining particles so as to negatively charge the remaining particles.

5. The method of claim 4, wherein the applying of the electric field comprises:
    applying a negative electric field to the positively charged particles; and
    applying a positive electric field to the negatively charged particles.

6. An apparatus for removing particles from a display panel, comprising:
    a charger configured to charge the particles; and
    a capturing unit configured to apply an electric field to the charged particles to capture the charged particles,
    wherein the capturing unit comprises:
    a metal bar arranged over the display panel to capture the charged particles;
    an electrode configured to charge the metal bar; and
    an insulating layer surrounding the metal bar to substantially prevent charge from being transferred from the charged particles to the metal bar.

7. The apparatus of claim 6, wherein the charger is configured to selectively apply a positive bias and a negative bias to the charged particles.

8. The apparatus of claim 6, wherein the capturing unit further comprises a transferring unit configured to move the metal bar over the panel.

9. The apparatus of claim 8, wherein the transferring unit comprises:
    a frame, wherein the metal bar is fixed to the frame; and
    an actuator configured to move the frame over the panel.

10. The apparatus of claim 6, further comprising:
    a plasma chamber; and
    a deposition chamber configured to form an organic layer under a pressure on the display panel,
    wherein the charging unit is arranged in the plasma chamber, and
    wherein the plasma chamber is adjacent to the deposition chamber.

11. The apparatus of claim 10, further comprising a buffer chamber, wherein the capturing unit is arranged in the buffer chamber, wherein the buffer chamber is configured to provide a pressure to the panel that is substantially the same as the pressure used for forming the organic layer, and wherein the buffer chamber is positioned between the deposition chamber and the plasma chamber.

12. The apparatus of claim 6, wherein the metal bar comprises a plurality of metal bars.

13. The apparatus of claim 12, wherein the electrode comprises:
    an anode configured to positively charge at least one of the metal bars; and
    a cathode configured to negatively charge the remaining of the metal bars.

14. The apparatus of claim 13, wherein the positively and negatively charged metal bars are alternately arranged.

15. An apparatus for removing organic and inorganic particles from a display panel, comprising:
    a charger configured to positively charge part of the particles and negatively charge the remaining particles; and
    a capturing unit configured to selectively apply positive and negative electric fields to the charged particles to capture the charged particles,
    wherein the capturing unit comprises:
    a metal bar arranged over the display panel to capture the charged particles;
    an electrode configured to charge the metal bar; and
    an insulating layer surrounding the metal bar to substantially prevent charge from being transferred from the charged particles to the metal bar.

16. The apparatus of claim 15, wherein the metal bar comprises a plurality of metal bars, wherein at least one of the metal bars is positively charged and the remaining metal bars are negatively charged, and wherein the positively and negatively charged metal bars are alternately arranged.

17. The apparatus of claim 15, wherein the capturing unit further comprises a transferring unit configured to move the metal bar substantially horizontally over the display panel.

* * * * *